Dec. 12, 1967 M. BELASCO 3,357,872

SEMICONDUCTOR DEVICES AND METHODS FOR MAKING SAME

Filed Oct. 18, 1965 2 Sheets-Sheet 1

INVENTOR
Melvin Belasco

BY William E. Johnson Jr.
ATTORNEY

Dec. 12, 1967 M. BELASCO 3,357,872
SEMICONDUCTOR DEVICES AND METHODS FOR MAKING SAME
Filed Oct. 18, 1965 2 Sheets-Sheet 2

INVENTORS
Melvin Belasco
BY
William E. Johnson Jr.
ATTORNEY

United States Patent Office 3,357,872
Patented Dec. 12, 1967

3,357,872
SEMICONDUCTOR DEVICES AND METHODS FOR MAKING SAME

Melvin Belasco, Dallas, Tex., assignor to Texas Instruments Incorporated, Dallas, Tex., a corporation of Delaware Filed Oct. 18, 1965, Ser. No. 496,844
6 Claims. (Cl. 148—175)

This invention relates to the diffusion of magnesium antimonide into gallium arsenide. More particularly it relates to the base diffusion for a GaAs transistor.

Among the group IIIa–Va compound semiconductor materials, gallium arsenide appears to be the most promising for the fabrication of high temperature semiconductor devices. However, difficulties have been encountered in attempting to form a P-N junction in bodies of gallium arsenide by vapor diffusion of impurities into the solid semiconductor body. The diffusion of a P-type layer into GaAs to form a base layer for an N-P-N transistor has presented an especially difficult task since the impurity profiles of the diffusants commonly known to the art do not follow an acceptable behavior pattern, usually falling outside the error functions of gaussian distributions. In addition to the unpredictable behavior, these impurity profiles are characterized by extremely high surface concentrations, approximately $2\times10^{18}$ impurities per cubic centimeter. This characteristic is present even for extremely shallow junction depths, for example two microns.

Magnesium has been successfully used as a P-type diffusant for fabricating base layers in GaAs transistors, as described in my copending application No. 463,989, filed June 15, 1965, and assigned to the assignee of the present application. However, when using magnesium it is necessary to diffuse the Mg into the GaAs to form a layer approximately 6–8 microns and then etch or lap away 4–6 microns of this layer from the surface to leave a layer having a width of approximately 2 microns. This removal of the outer portion of the diffused layer is done to thus result in a new surface with a tolerable surface impurity concentration.

It is therefore an object of the invention to provide a new method for forming a P-N junction in a gallium arsenide semiconductor body without the necessity of etching or lapping.

It is a further object of the invention to provide a method for fabricating a base region in a gallium arsenide transistor using magnesium antimonide as a diffusant source.

It is another object of the invention to provide gallium arsenide transistors with thin diffused base layers and methods for making same.

In accordance with the invention, an NPN gallium arsenide transistor is produced by the diffusion by conventional vapor-solid-diffusion techniques of P-type impurity magnesium antimonide ($Mg_3Sb_2$) into the surface of an epitaxial N-type gallium arsenide (GaAs) wafer to form a P-type layer 2 to 3 microns deep on the GaAs substrate, thereby forming a P-N junction. The wafer is then etched and further processed in the conventional manner to form an NPN gallium arsenide transistor, the 2 to 3 micron thick P-type layer serving as the base.

The vapor pressure of Mg above the compound $Mg_3Sb_2$ is substantially less than above pure Mg under the same conditions. As a result of the lower vapor pressure, $Mg_3Sb_2$ source diffusions into GaAs produce an electrically active magnesium distribution in the GaAs which has a significantly lower impurity concentration as a function of distance from the surface than diffusions form a pure magnesium source.

The diffusion of magnesium is thought to occur in two steps, one an interstitial diffusion mode and the other a substitutional mode. However, the diffusion of pure magnesium has not permitted a clear differentiation between the two modes. As will be illustrated, $Mg_3Sb_2$ as a diffusant source does clearly differentiate between the two modes. This two-step diffusion process can be exploited, according to the invention, to provide improved transistor performance. The high surface concentration and low concentration only a short distance from the surface serves to reduce the base resistance (*rb*), lower the emitter-base voltage drop ($V_{BE}$), and at the same time provide a higher emitter efficiency. The higher emitter efficiency furnishes a higher common emitter forward current transfer ratio ($H_{FE}$), a common transistor figure of merit. However, the concentration of P-type impurities at the surface of the wafer is low enough to be compatible with emitters formed by diffusion of Group IVa elements, such as sulfur, selenium and tellurium.

These and other objects, features and advantages of the invention will become more readily understood in the following detailed description when read in conjunction with the appended claims and attached drawings, in which:

Similar reference characters denote corresponding parts throughout the several views of the drawing.

Figure 1:
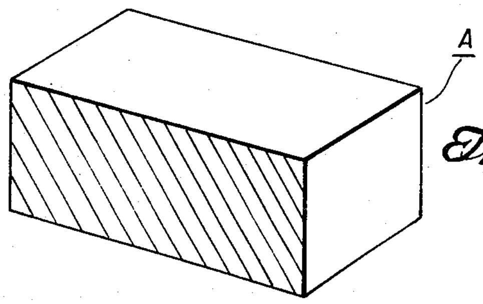
FIGURE 1 is a perspective view in section of an N-type gallium arsenide wafer.
Figures 2, 3:
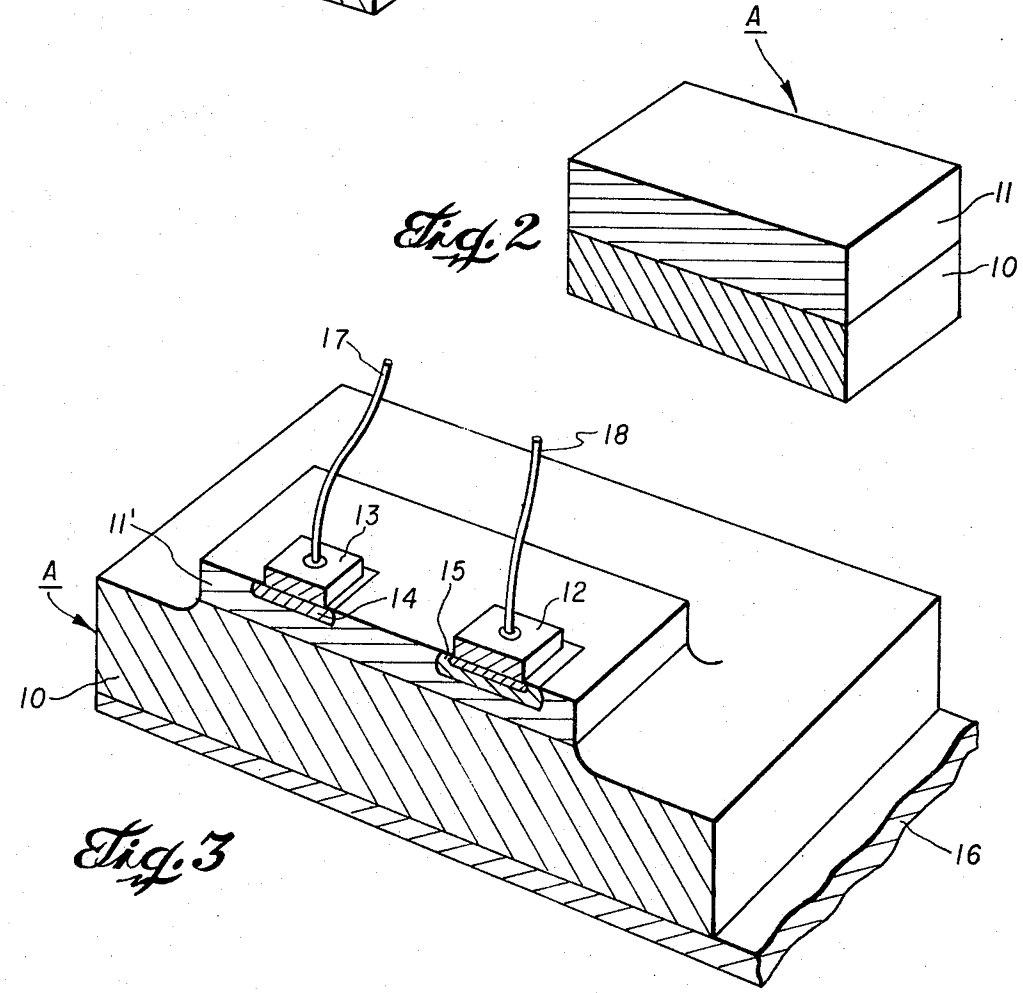
FIGURE 2 is a perspective view in section of the wafer of FIGURE 1 having a P-type layer diffused therein.
FIGURE 3 is a perspective view partially in section of an NPN gallium arsenide transistor utilizing the wafer and diffused layer of FIGURE 2.

In FIGURE 1 an N-type gallium arsenide wafer designated by the general reference character A is shown. A P-type diffused layer 11, as shown in FIGURE 2, is formed in wafer A by the diffusion of the P-type conductivity determining impurity magnesium antimonide thereinto by any suitable conventional vapor-solid diffusion technique. In the preferred embodiment of the invention, wafer A is an N-type gallium arsenide wafer having approximately $1\times10^{16}$ impurities per cubic centimeter, which has been lapped and polished to about 30 mils thickness. Wafer A is placed in a quartz ampoule of about 100 cubic centimeters which also contains approximately 0.5 milligram of arsenic and 0.5 milligram of magnesium antimonide. The quartz ampoule is then evacuated, sealed and placed in a furnace at approximately 1050° C., for about 75 minutes. Under these conditions a P-type layer 11 is formed by the diffusion of the P-type impurities into the wafer A, the P-type layer being approximately 2.75 microns deep. The remainder of the wafer A is unaffected by the diffusion and retains its original N-type conductivity. Thus a wafer is formed as shown in FIGURE 2, having a region of P-type conductivity 11 adjacent a region of N-type conductivity 10. The P-type layer has a sheet resistance of approximately 150 ohms/square.

After diffusion, the wafer is masked so that only the top surface of the P-type layer is exposed. The exposed surface is then subjected to a suitable etching solution for a sufficient period of time to allow the etchant to improve the surface of the P-type layer which may have been slightly eroded during the diffusion process. An example of such an etch is a solution of $$H_2SO_4:H_2O_2:H_2O\ (8:1:1)$$

usually applied for about twenty seconds.

The wafer A of FIGURE 2 is then further processed by conventional methods to form an NPN gallium arsenide transistor.

An NPN gallium arsenide transistor as shown in FIGURE 3 may be formed from the wafer of FIGURE 2 by masking and etching the top surface of the P-type layer 11 to form a mesa 11' of the P-type material on the N-type portion 10 of the wafer A. Emitter and base contacts 12 and 13, respectively, are then formed by evaporation of suitable contact materials in the desired configurations by conventional techniques. When the contacts 12 and 13 are alloyed into the P-type mesa 11', an ohmic regrowth region 14 is formed under the base contact 13. The emitter contact 12, which contains an N-type dopant such as tin, sulfur, selenium or tellurium, forms an N-type region 15 when alloyed with the gallium arsenide. The N-type region 15 may be formed by the diffusion of donor impurities from the contact alloy 12 or by the formation of a regrowth region saturated with the constituents of the contact alloy. An ohmic connection such as a strip of a gold-selenium alloy 16 is attached to the back surface of the N-type wafer 10, and suitable leads such as gold wires 17 and 18 are attached to the base and emitter contacts, respectively. Thus, an NPN gallium arsenide transistor is produced wherein the original N-type wafer 10 constitutes the collector, the remaining portion of the P-type diffused layer 11' constitutes the base, and the N-type region 15 constitutes the emitter.

Figure 4:
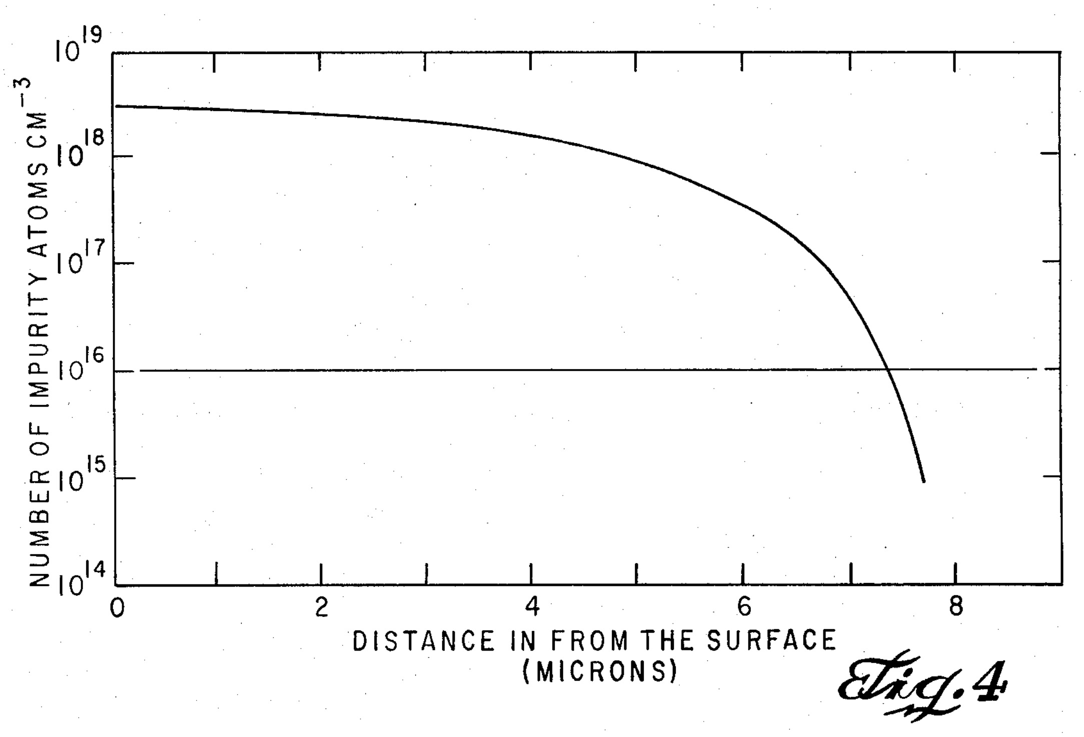
FIGURE 4 is a graphic illustration of a magnesium impurity distribution resulting from a pure magnesium diffusion.
Figure 5:
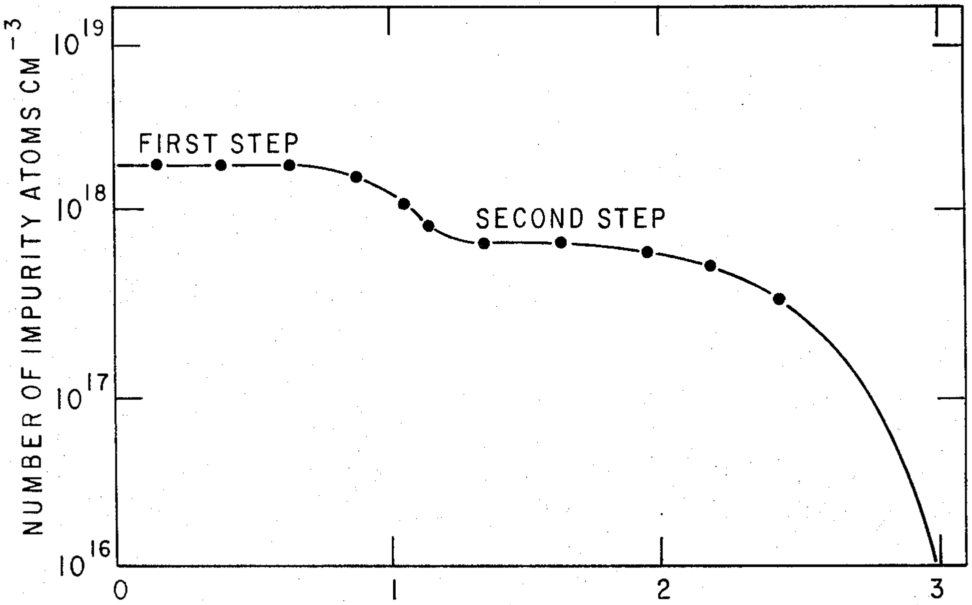
FIGURE 5 is a graphic illustration of a magnesium impurity distribution resulting from a magnesium antimonide diffusion.

The advantages of the method of the invention are graphically illustrated in FIGURES 4 and 5. In FIGURE 4 the magnesium distribution in a magnesium diffused P-type layer is illustrated. The distribution shown is typically observed when an N-type gallium arsenide wafer is maintained at 1100° C. for 75 minutes in an enclosed diffusion ampoule containing 0.5 milligram arsenic and 0.5 milligram magnesium. Under these conditions the resultant impurity distribution curve is relatively flat over about the first two-thirds of the diffused layer and then changes to a distribution which is approximately a complementary error function over the last one-third. This distribution is characteristic of most known acceptor impurities when diffused into gallium arsenide.

By diffusing $Mg_3Sb_2$ to form the P-type layer, the layer has an impurity distribution as shown in FIGURE 5. It will be noted that the impurity distribution over the range from about $8 \times 10^{18}$ atoms/cm.$^3$ at the surface to the point where the P-type impurity concentration is equal to the residual donor concentration in the original material ($10^{16}$ atoms/cm.$^3$) is approximately a complementary error function.

It should be appreciated from a comparison of FIGURES 4 and 5 that the etching step used with a device having a diffusion profile similar to that of FIGURE 4 is not necessary with a device having a diffusion profile like that shown in FIGURE 5, since the profile of FIGURE 5 drops rather abruptly after a distance of only two or three microns from the surface.

It is to be understood that the transistor configuration shown and described with reference to FIGURE 3 is the preferred embodiment utilizing the P-type layer formed in accordance with this invention. Other configurations such as planar devices and devices having diffused or alloyed emitter regions may also be formed utilizing the P-type layer formed in accordance with this invention. Other advantages and features of the invention will become readily apparent to those skilled in the art.

It is to be understood that the form of his invention herewith shown and described is to be taken as a preferred example of the same and that various changes may be resorted to without departing from the spirit and scope of the invention as defined by the appended claims.

What is claimed is:

1. The method of diffusing magnesium antimonide into gallium arsenide comprising the step of heating magnesium antimonide in the presence of heated gallium arsenide.

2. The method of forming a P-N junction comprising:
(a) epitaxially depositing an N-type layer of gallium arsenide upon an N-type gallium arsenide substrate;
(b) enclosing said body with said epitaxial layer and magnesium antimonide in a quartz ampoule; and
(c) heating said ampoule, thereby to cause said magnesium antimonide to diffuse into said N-type layer.

3. The method of diffusing magnesium antimonide into gallium arsenide comprising the step of heating magnesium antimonide in the presence of heated arsenic and heated gallium arsenide.

4. The method of diffusing magnesium antimonide into gallium arsenide comprising the steps of:
(A) placing the following approximate proportions into a quartz diffusion ampoule;
(a) .5 mg. of $Mg_3Sb_2$,
(b) .5 mg. of As, and
(c) an N-type epitaxial GaAs slice;
(B) evacuating and sealing off said ampoule;
(C) heating said ampoule to approximately 1050° C. for about 75 minutes.

5. The method of forming a P-N juction comprising:
(A) placing the following approximate proportions into a quartz diffusion ampoule;
(a) .5 mg. of $Mg_3Sb_2$;
(b) .5 mg. of As, and
(c) an N-type epitaxial GaAs slice;
(B) evacuating and sealing off said ampoule;
(C) heating said ampoule to approximately 1050° C. for about 75 minutes;
(D) etching said slice for about 20 seconds in a solution having the following approximate proportions:
(a) 8 volumes of $H_2SO_4$,
(b) 1 volume of $H_2O_2$, and
(c) 1 volume of $H_2O$.

6. In the process of making a gallium arsenide transistor, the steps of:
(a) diffusing magnesium antimonide into a portion of an N-type conductivity gallium arsenide substrate, thereby to form a diffused P-type layer required for the base layer of said transistor;
(b) forming an N-type emitter region in said base layer; and
(c) attaching leads to said base layer and said emitter region.

References Cited

UNITED STATES PATENTS

| | | | |
|---|---|---|---|
| 3,226,225 | 12/1965 | Weiss et al. | 252—62.3 |
| 3,245,847 | 4/1966 | Pizzarello | 252—62.3 |
| 3,249,473 | 5/1966 | Nolonyak | 252—62.3 |
| 3,305,412 | 2/1967 | Pizzarello | 148—189 |

DAVID L. RECK, *Primary Examiner.*

N. F. MARKVA, *Assistant Examiner.*